United States Patent [19]
Ono

[11] Patent Number: 5,923,715
[45] Date of Patent: Jul. 13, 1999

[54] DIGITAL PHASE-LOCKED LOOP CIRCUIT

[75] Inventor: Masayoshi Ono, Yokohama, Japan

[73] Assignee: Kabushiki Kaisha Toshiba, Tokyo, Japan

[21] Appl. No.: 08/772,008

[22] Filed: Dec. 19, 1996

[51] Int. Cl.$^6$ .................................................... H03D 3/24
[52] U.S. Cl. ........................... 375/376; 375/375; 331/57; 331/25; 331/1 A
[58] Field of Search ..................................... 375/376, 375; 331/18, 1 A, 25, 1 R, 57, 48; 327/158, 159, 156, 149, 150, 147

[56] References Cited

U.S. PATENT DOCUMENTS

| | | | |
|---|---|---|---|
| 5,347,234 | 9/1994 | Gersbach et al. | 331/57 |
| 5,487,093 | 1/1996 | Adresen et al. | 375/376 |
| 5,687,202 | 11/1997 | Eitrheim | 375/376 |

*Primary Examiner*—Stephen Chin
*Assistant Examiner*—Betsy L. Deppe
*Attorney, Agent, or Firm*—Loeb & Loeb LLP

[57] ABSTRACT

A digital PLL circuit is provided that has a frequency comparator circuit for comparing the frequencies of an output clock signal and a reference clock signal to generate frequency comparator information. A delay control circuit generates a predetermined digital signal based on the frequency comparator information, and a clock signal generating circuit generates the output clock signal of the PLL circuit. The clock signal generating circuit changes the oscillation frequency of the output clock signal in response to the predetermined digital signal generated by the delay control circuit. According to a preferred embodiment, the number of connected delay stages in a variable delay circuit (of the clock signal generating circuit) is controlled on the basis of the output of the frequency comparator circuit. Additionally, variable load capacitance circuits in the variable delay circuit are controlled mainly on the basis of the output of the frequency comparator. In this way, the present invention provides a digital PLL having small jitter and a high accuracy, without requiring a complicated control algorithm.

22 Claims, 13 Drawing Sheets

DIGITAL PHASE-LOCKED LOOP CIRCUIT

FIELD OF THE INVENTION

The present invention relates to a phase-locked loop ("PLL") circuit, and more specifically to a digital PLL circuit having a frequency comparator circuit so that the PLL circuit provides small jitter and a high accuracy, without requiring a complicated control algorithm.

BACKGROUND OF THE INVENTION

Phase-locked loop ("PLL") circuits are widely used in many fields, and can be used in any field suitable for integration of high frequency circuits. In particular, PLL circuits are used in various signal processing circuits, such as AM and FM radios, televisions, wireless communication equipment, frequency synthesizers, and multiplex stereo demodulating circuits. In general, a PLL circuit is a feedback loop in which the frequency and phase of a signal produced by a variable oscillator is locked to that of a reference signal. A PLL circuit can be used for demodulating a baseband signal from a frequency-modulated carrier wave. A basic PLL circuit includes a phase comparator and a voltage controlled oscillator. In operation, the phase comparator compares a modulated incoming signal with the output of the voltage controlled oscillator, and the output of the phase comparator controls the oscillation frequency of the voltage controlled oscillator.

FIG. 11 is a block diagram of a conventional digital PLL circuit. As shown, a reference clock signal is supplied to a phase comparator 74, and the output of the phase comparator is supplied to a delay control circuit 73. A variable delay circuit 76 receives the output of the delay control circuit 73, and the output of the variable delay circuit is supplied to an inverter 77. The output of the inverter 77 is fed back to the variable delay circuit 76 so that the variable delay circuit and the inverter form a ring oscillator. The output signal from the ring oscillator (i.e., the inverter) is used as an output clock signal and is also supplied to the phase comparator 74 for comparison with the reference clock signal. The delay control circuit 73 controls the variable delay circuit 76 based on the output of the phase comparator 74 so that the reference clock signal and the output clock signal coincide in phase.

Typically, the variable delay circuit 76 is formed of a string of inverters, and the value of the delay is varied by changing the number of connected inverters. However, relying only upon changes in the number of connected inverters produces a circuit having values of delay that are only roughly controllable. If variable load capacitance circuits (including capacitors) are connected to the output of an inverter, the number of connected capacitors can be changed to vary the output load capacitance of the inverter. This allows more precise control of the delay value, and thus, a higher accuracy digital PLL circuit can be obtained. In such a circuit, the delay control circuit 73 controls the number of connection stages and the output load capacitance of the inverters of the variable delay circuit 76 on the basis of the output from the phase comparator 74.

However, in the conventional digital PLL circuit described above, there exists a drawback in that designing the delay control circuit 73 to lock as a PLL circuit is very difficult because the phase comparison output controls the delay control circuit even after the output clock signal has been more accurately controlled by the output load capacitance of the variable delay circuit 76. For example, even when the frequency of the output clock signal coincides with the frequency of the reference clock signal, if the phase of the output clock signal is behind the phase of the reference clock signal, the delay control circuit 73 operates to decrease the delay value of the variable delay circuit 76 in response to the output of the phase comparator 74. In many cases, repeating this operation to make the phases of the two clock signals coincide causes the frequencies of the two signals to not coincide. Then, the delay control circuit 73 operates to establish coincidence in frequency. As a result, these competing operations are repeated and it takes a long time and many repetitions to make both the frequencies and the phases of the two clock signals coincide.

As described above, it is difficult to design the conventional digital PLL circuit, and particularly difficult to design the delay control circuit, so as to ensure that the output clock signal and the reference clock signal coincide in both phase and frequency. As a result, conventional designs include a complicated structure and an extremely complicated algorithm for controlling the delay control circuit. The conventional digital PLL circuit also suffers from another drawback in that, even after the PLL circuit is locked, the delay control circuit modifies the delay value of the variable delay circuit when even a slight phase shift occurs. This causes the frequency of the output clock signal to change, and thus, increases the amount of jitter in the signal.

SUMMARY OF THE INVENTION

In view of these problems, it is an object of the present invention to remove the above-mentioned drawbacks and to provide a digital PLL circuit having small jitter and a high accuracy that can be easily designed and controlled, thus avoiding a complicated control algorithm.

According to a preferred embodiment of the present invention, a digital PLL circuit is provided that includes a frequency comparator circuit and a delay control circuit. The frequency comparator compares frequencies of an output clock signal and a reference clock signal to generate frequency comparator information, and the delay control circuit generates an output signal based on the frequency comparator information. Additionally, a clock signal generating circuit generates the output clock signal, and changes the frequency of the output clock signal in response to the output signal from the delay control circuit.

Additionally, in another embodiment of the present invention, the digital PLL circuit also includes a frequency divider circuit for dividing the frequency of an output clock signal and generating a frequency-divided output clock signal. The frequency comparator circuit compares the frequencies of the frequency-divided output clock signal and a reference clock signal to generate the frequency comparator information.

In another preferred embodiment of the present invention, a digital PLL circuit is provided that includes a frequency comparator circuit and a phase comparator circuit. The frequency comparator compares the frequencies of an output clock signal and a reference clock signal to generate frequency comparator information, and the phase comparator compares phases of the output clock signal and the reference clock signal to generate phase comparator information. Additionally, a variable frequency oscillator generates the output clock signal, and controls the frequency and phase of the output clock signal on the basis of the frequency comparator information and the phase comparator information to frequency and phase lock the output clock signal with the reference clock signal.

Additionally, according to another embodiment of the present invention, the digital PLL circuit also includes a first frequency divider circuit for dividing the frequency of an output clock signal to generate a frequency-divided output clock signal, and a second frequency divider circuit for dividing the frequency of a reference clock signal to generate a frequency-divided reference clock signal In this embodiment, the frequency comparator circuit compares the frequencies of the frequency-divided output clock signal and the frequency-divided reference clock signal to generate the frequency comparator information, and the phase comparator circuit compares the phases of the frequency-divided output clock signal and the frequency-divided reference clock signal to generate the phase comparator information.

Other objects, features, and advantages of the present invention will become apparent from the following detailed description. It should be understood, however, that the detailed description and specific examples, while indicating preferred embodiments of the invention, are given by way of illustration only and various modifications may naturally be performed without deviating from the scope of the present invention.

DETAILED DESCRIPTION OF PREFERRED EMBODIMENTS

Preferred embodiments of the present invention will be described in detail hereinbelow with reference to the attached drawings.

Figure 1:
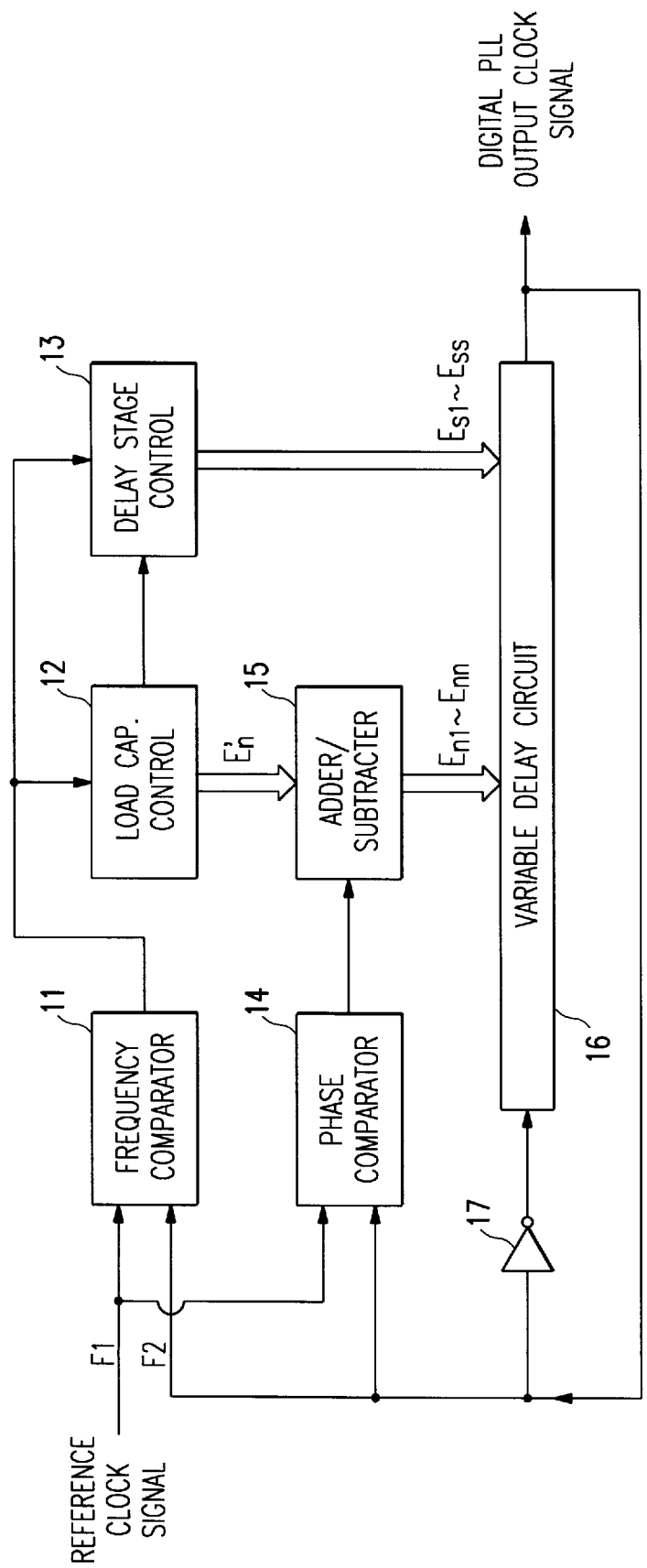
FIG. 1 is a block diagram of a digital PLL circuit according to a first embodiment of the present invention.

FIG. 1 is a block diagram of a digital PLL circuit according to a first embodiment of the present invention. A frequency comparator circuit 11 compares the frequency of the output clock signal with the frequency of a reference clock signal to generate an output signal containing frequency comparator information. A load capacitance control circuit 12 receives the output of the frequency comparator circuit 11, and generates an output signal, which contains load capacitance control information, for controlling the load capacitance of a variable delay circuit 16. The output of the frequency comparator circuit 11 is also supplied to a delay stage control circuit 13 that generates delay stage control information for controlling the number of delay stages (i.e., the number of connected inverters) in the variable delay circuit 16.

Additionally, a phase comparator circuit 14 compares the phase of the output clock signal with the phase of the reference clock signal to generate an output signal containing phase comparator information. An adder/subtracter circuit 15 receives the output of the phase comparator circuit 14 and the output of the load capacitance control circuit 12. Based on the output of the phase comparator, the adder/subtracter circuit 15 increments or decrements the load capacitance control information from the load capacitance control circuit 12 to generate an output signal containing load capacitance additive/subtractive control information. The variable delay circuit 16 receives the output of the delay stage control circuit 13 and the output of the adder/subtracter circuit 15. The variable delay circuit 16 controls the number of delay stages on the basis of the output of the delay stage control circuit 13, and controls the load capacitance based on the output of the adder/subtracter circuit 15. An inverter 17 is connected between the output of the variable delay circuit 16 and the input of the variable delay circuit so that the inverter and the variable delay circuit form a ring oscillator.

Thus, in the present invention, the control of delay stages of the variable delay circuit 16 is not based upon the phase comparator information. Instead, the number of delay stages is based upon the frequency comparator information. Further, the adder/subtracter 15, which controls the load capacitance in the variable delay circuit 16, is controlled mainly by the frequency comparator information and is only secondarily controlled by the phase comparator information. These features allow the digital PLL circuit of the first embodiment of the present invention to have small jitter and a high accuracy, without requiring a complicated control algorithm Additionally, the variable delay circuit includes inverters having a variable number of connection stages and variable load capacitance circuits (including capacitors) connected to the output of an inverter regardless of changes in the number of connection stages. This allows the variable delay circuit to precisely control the delay value by varying the number of inverter connection stages and by controlling the output load capacitance of the inverters.

Figure 2:
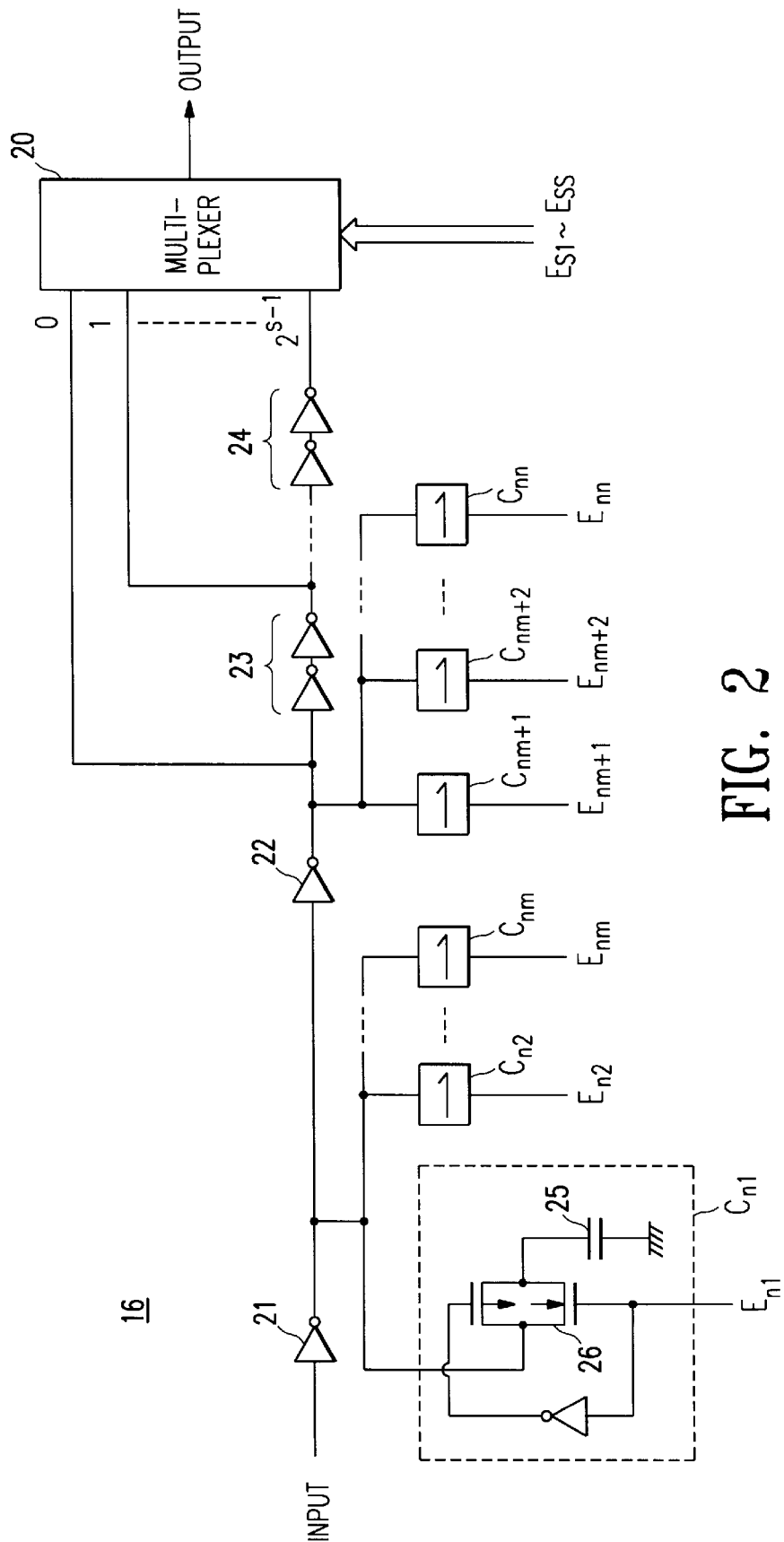
FIG. 2 is a block diagram of an embodiment of the variable delay circuit of FIG. 1.

FIG. 2 is a block diagram of a preferred embodiment of the variable delay circuit shown in FIG. 1. The variable delay circuit 16 includes a first stage of serially-connected inverters 21 and 22 that is used regardless of changes in the number of connection stages. Additionally, $2^{s-1}$ stages of inverter pairs 23 and 24, which each include two inverters, are provided to be selectively used on the basis of the selected number of connection stages. The output of each of the $2^s$ stages of inverters is supplied to a multiplexer 20 to allow the number of connection stages to be controlled. Further, variable load capacitance circuits $C_{n1}$ through $C_{nm}$ and variable load capacitance circuits $C_{nm+1}$ through $C_{nm}$ (which contain capacitors) are used for setting the output load capacitances of the inverters 21 and 22 of the first stage. As explained above, the delay value can be more accurately controlled by changing both the number of connection stages and the output load capacitance of the inverters.

The operation of the variable delay circuit shown in FIG. 2 will now be explained. The multiplexer 20 is supplied with delay stage control signals $E_{s1}$ through $E_{ss}$, which are signals output from the delay stage control circuit 13 for controlling the number of delay stages (see FIG. 1). One of the input terminals 0 through $2^{s-1}$ of the multiplexer 20 is selected based on the value of the delay stage control signals $E_{s1}$ through $E_{ss}$. Because each input terminal of the multiplexer is connected to the output of one of the $2^s$ stages of inverters, a selected number of stages of inverters (corresponding to the selected input terminal) are connected to the output of the variable delay circuit to generate a predetermined delay value. Therefore, by changing the number of connection stages using the delay stage control signals $E_{s1}$ through $E_{ss}$, the delay value of the variable delay circuit can be controlled. However, such control only allows the delay value to be adjusted in steps equal to the delay value of two inverters (i.e., one connection stage).

To allow more accurate control of the delay value, variable load capacitance circuits ($C_{n1}$ through $C_{nm}$ and $C_{nm+1}$ through $C_{nn}$) are selectively connected to the outputs of the first stage inverters 21 and 22, respectively, regardless of changes in the number of connection stages. More specifically, each variable load capacitance circuit C is made up of a capacitor 25 and an analog switch 26, as is shown for circuit $C_{n1}$. Each variable load capacitance circuit C opens or closes its analog switch based on the value of one of the load capacitance additive/subtractive control signals $E_n$ (see FIG. 1). As explained above, the load capacitance additive/subtractive control signals are output from the adder/subtracter circuit 15 based on the load capacitance control information from the load capacitance control circuit 12 and the output of the phase comparator 14.

Control signals $E_{n1}$ through $E_{nm}$ and $E_{nm+1}$ through $E_{nn}$ having a value of "1" close the analog switches of the corresponding variable load capacitance circuits to connect their capacitors to the output of the inverter 21 or 22. In contrast, control signals $E_{n1}$ through $E_{nm}$ and $E_{nm+1}$ through $E_{nn}$ having a value of "0" open the analog switches of the corresponding variable load capacitance circuits to disconnect their capacitors from the output of the inverter 21 or 22. Thus, the output load capacitance of the inverters 21 and 22 is increased or decreased based on the load capacitance additive/subtractive control signals $E_n$. This allows the delay value of the variable delay circuit to be more accurately adjusted.

Figure 3:
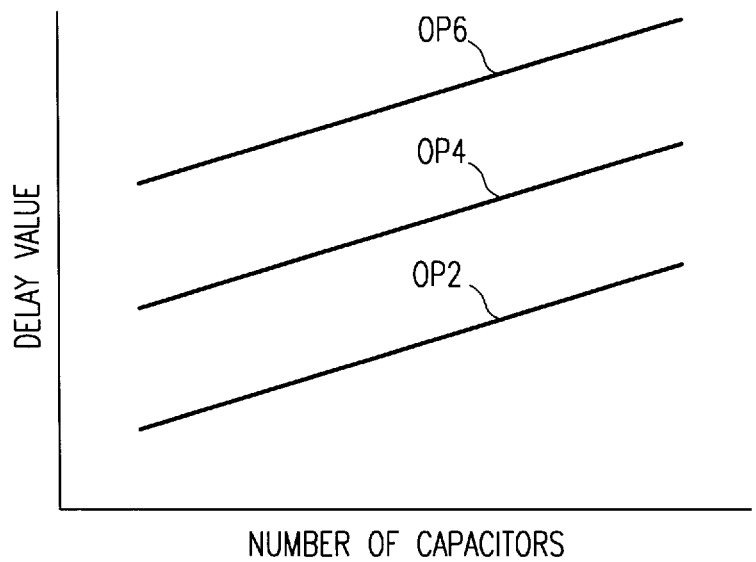
FIG. 3 is a graph showing changes in delay value with changes in the number of connected inverters in the variable delay circuit and changes in the output load capacitance connected to the inverters.

FIG. 3 is a graph showing the delay value of the variable delay circuit with respect to changes in the number of connection stages and changes in the output load capacitance. In the graph, the lines OP2, OP4, and OP6 show the delay value of the output signal from the variable delay circuit with connection of two, four, and six inverters, respectively. Each line shows that a continuous increase (actually a continuation of small steps) in the delay value occurs due to the highly accurate adjustment of the delay value allowed by the variable load capacitance circuits. Further, adjustment of the delay value through changes in connection stages is done for every two inverters, and the amount of adjustment of the delay value permitted by the variable load capacitance circuits is typically not less than the delay value of two inverters. For example, the delay value at the right end of line OP2 and the delay value at the left end of line OP4 are continuous or partly overlap. Thus, the variable delay circuit of the first embodiment of the present invention allows a continuous, highly-accurate control of the delay value.

Figure 4A:
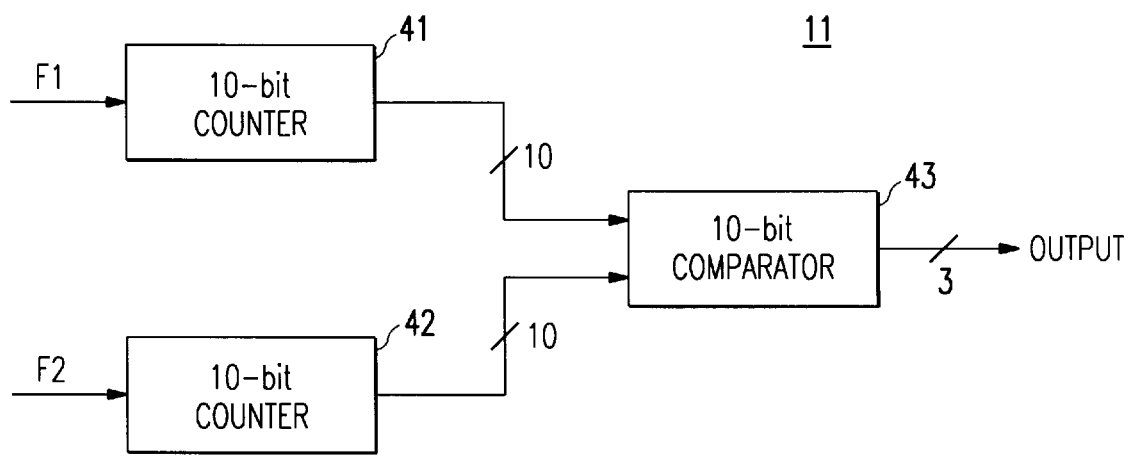
FIG. 4(a) is a block diagram of a frequency comparator circuit.

The operation of the digital PLL circuit of FIGS. 1 and 2 will now be explained. First, the operation of the digital PLL to cause the frequencies of the reference clock signal and the output clock signal to coincide will be explained. FIG. 4(a) shows a block diagram of a preferred embodiment of the frequency comparator circuit 11 of FIG. 1. As shown, each of the two clock signals (F1 and F2) is supplied to a respective 10-bit counter (41 and 42). A 10-bit comparator 43 receives the outputs of the two counters. The two counters 41 and 42 count periods of the reference clock signal F1 and the output clock signal F2, respectively. When one of the counters counts the full count of 10 bits (i.e., to $2^{10}$), both counters are stopped by control logic circuitry. Then, the count values output by the two counters are stored in register circuits and compared by the comparator 43. In a preferred embodiment, a register circuit is included in each of the counters. The result of the comparison is output by the frequency comparator 11 as the frequency comparator information. In this embodiment, the frequency comparator outputs a three bit signal (e.g., always having a "1" and two "0"'s) to indicate which count value is higher or that the two count values are equal.

Figure 4B:
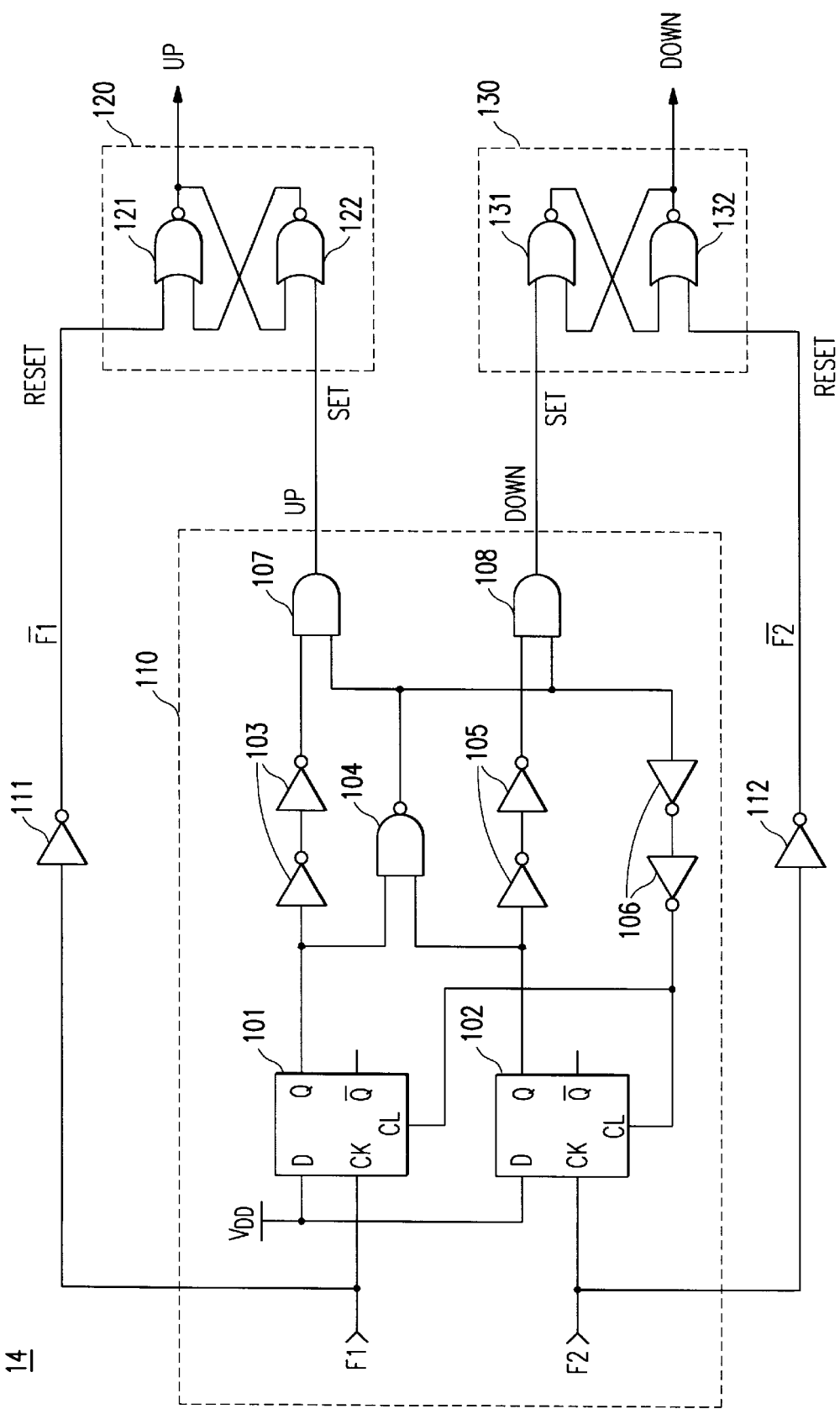
FIG. 4(b) is a block diagram of a phase comparator circuit.
Figure 4C:
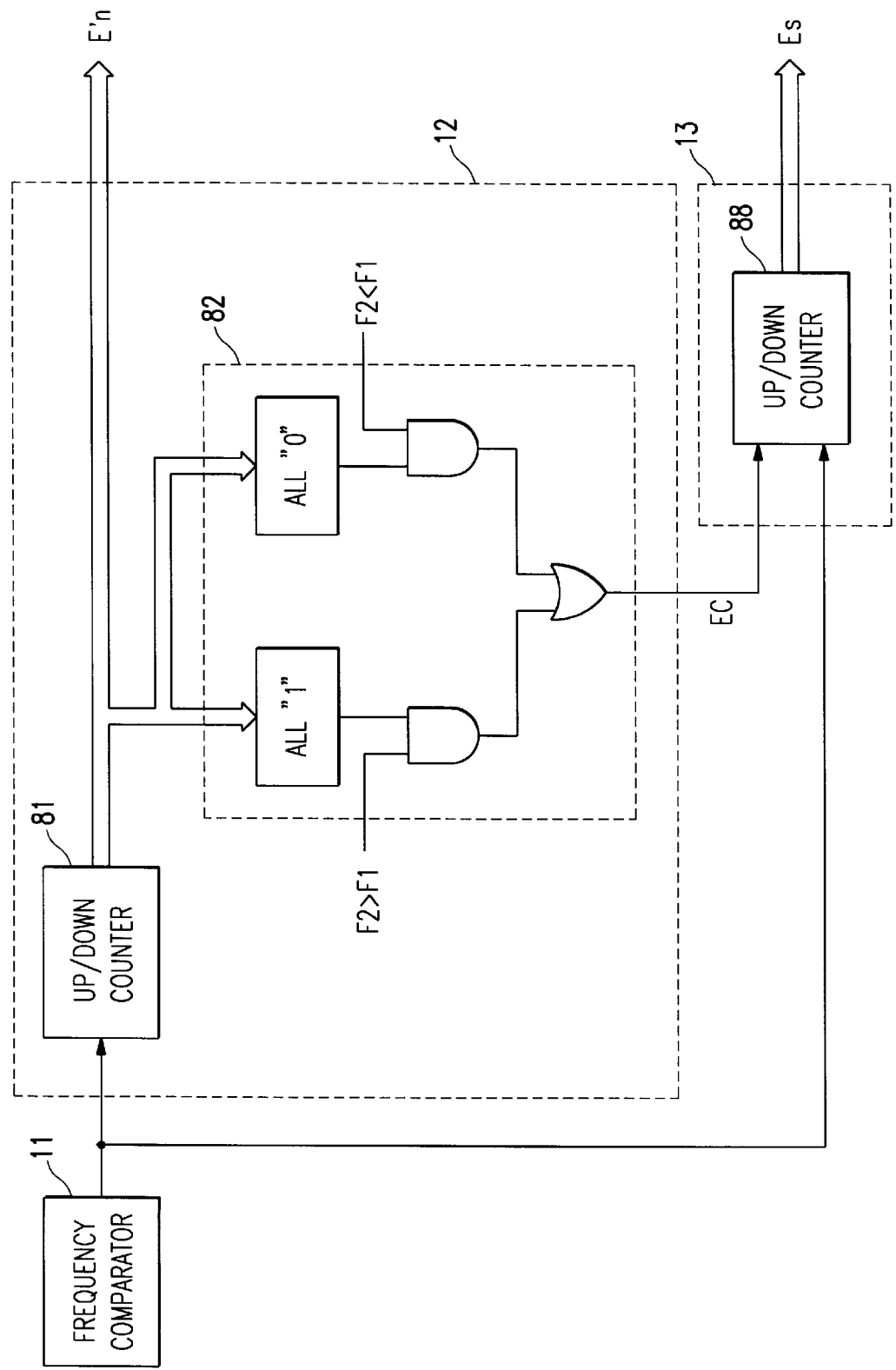
FIG. 4(c) is a block diagram showing a load capacitance control circuit and a delay stage control circuit.

In response to the frequency comparator information, the load capacitance control circuit 12 and the delay stage control circuit 13 set the values of the load capacitance control signals $E'_n$ and the delay stage control signals $E_s$, respectively. FIG. 4(c) shows a block diagram of preferred embodiments of the load capacitance control circuit 12 and the delay stage control circuit 13 of FIG. 1. As shown, a first up/down counter 81 receives the frequency comparator information. The output $E'_n$ of the first up/down counter 81 is supplied to an enable logic circuit 82 and to the adder/subtracter circuit 15. The enable logic circuit contains logic circuitry that generates an enable signal EC when either the output of the first up/down counter is all "1"'s and the frequency of the output clock signal F2 is greater than the frequency of the reference clock signal F1 or the output of the first up/down counter is all "0"'s and the frequency of output clock signal F2 is less than the frequency of the reference clock signal F1. In the embodiment of FIG. 4(c), the adder/subtracter circuit 15 includes a decoder for generating the load capacitance additive/subtractive control signals $E_n$. In other embodiments, the decoder is included in the load capacitance control circuit 12. Additionally, the delay stage control circuit 13 includes a second up/down counter 88 that receives the enable signal EC from the load capacitance control circuit 12 and the frequency comparator information from the frequency comparator 11. The output $E_s$ of the second up/down counter 88 is supplied to the variable delay circuit 16.

In more detail, if the frequency comparator indicates that the frequency of the output clock signal is higher than the frequency of the reference clock signal, the load capacitance control circuit 12 counts up to increase by one the number of active load capacitance control signals $E'_{n1}$ through $E'_{nm}$. That is, the number of signals having a value of "1" among signals $E'_{n1}$ through $E'_{nm}$ is increased by one. As a result, an additional capacitor is connected to the first stage inverters to slightly increase the output load capacitance of the inverters. This, in turn slightly decreases the frequency of the output clock signal. If, upon the next frequency comparison, the frequency of the output clock signal is still higher than the frequency of the reference clock signal even after connecting the additional capacitor, the number of signals having a value of "1" among signals $E'_{n1}$ to $E'_{nn}$ is again increased by one in the same manner. This operation is repeated until the frequencies of the output clock signal and the reference clock signal become equal.

If the frequency of the output clock signal is still higher than the frequency of the reference clock signal after all of the load capacitance control signals $E'_{n1}$ through $E'_{nn}$ become "1", all of the signals $E'_{n1}$ to $E'_{nn}$ are reset to "0", and the reset information is sent to the delay stage control circuit 13. The delay stage control circuit 13 responds to the reset information by incrementing the value of the delay stage control signal $E_s$. As a result, the number of connected inverters in the variable delay circuit 16 increases by two (i.e., one more connection stage is used). These operations of the load capacitance control circuit 12 and delay stage control circuit 13 continue as explained above until the frequencies of the output clock signal and the reference clock signal become equal. Because the amount of adjustment of the delay value permitted by the variable load capacitance circuits is typically not less than the delay value of two inverters, the variable delay circuit allows a continuous, highly-accurate control of the delay value.

Accordingly, in the first embodiment of the present invention, by increasing step by step the number of connection stages and the output load capacitance, the frequency of the digital PLL circuit output clock signal decreases gradually until it becomes equal to the frequency of the reference clock signal. In this manner, a stable coincidence in frequency is established.

The digital PLL circuit operates as explained above when the frequency of the output clock signal is higher than the frequency of the reference clock signal. Conversely, if the frequency of the output clock signal is lower than the frequency of the reference clock signal, the opposite operation is performed. Specifically, if the frequency comparator indicates that the frequency of the output clock signal is lower than the frequency of the reference clock signal, the load capacitance control circuit 12 counts down to decrease by one the number of active load capacitance control signals $E'_{n1}$ through $E'_{nn}$. That is, the number of signals having a value of "1" among signals $E'_{n1}$ through $E'_{nn}$ is decreased by one. As a result, one less capacitor is connected to the first stage inverters to slightly decrease the output load capacitance of the inverters. This, in turn, slightly increases the frequency of the output clock signal. If, upon the next frequency comparison, the frequency of the output clock signal is still lower than the frequency of the reference clock signal even after connecting one less capacitor, the number of signals having a value of "1" among signals $E'_{n1}$ to $E'_{nn}$ is again decreased by one in the same manner. This operation is repeated until the frequencies of the output clock signal and the reference clock signal become equal.

If the frequency of the output clock signal is still lower than the frequency of the reference clock signal after all of the load capacitance control signals $E'_{n1}$ through $E'_{nn}$ become "0", all of the signals $E'_{n1}$ to $E'_{nn}$ are reset to "1", and the reset information is sent to the delay stage control circuit 13. The delay stage control circuit 13 responds to the reset information by decrementing the value of the delay stage control signal $E_s$. As a result, the number of connected inverters in the variable delay circuit 16 decreases by two (i.e., one less connection stage is used). These operations of the load capacitance control circuit 12 and delay stage control circuit 13 continue as explained above until the frequencies of the output clock signal and the reference clock signal become equal.

Accordingly, in the first embodiment of the present invention, by reducing step by step the number of connection stages and the output load capacitance, the frequency of the digital PLL circuit output clock signal increases gradually until it becomes equal to the frequency of the reference clock signal. In this manner, a stable coincidence in frequency is established. Furthermore, because the oscillation frequency of the ring oscillator formed by the variable delay circuit 16 and the inverter 17 (i.e., the frequency of the output clock signal) is determined by the number of connection stages and the output load capacitance, a highly accurate oscillation frequency can be obtained once the digital PLL circuit of the present invention locks on the correct frequency.

The operation of the digital PLL circuit of FIGS. 1 and 2 to cause the phases of the reference clock signal and the output clock signal to coincide will now be explained. The phase matching is performed by the phase comparator circuit 14 and the adder/subtracter circuit 15 (FIG. 1). FIG. 4(b) shows a block diagram of a preferred embodiment of the phase comparator circuit 14 of FIG. 1. Output signals from a phase difference detector 110 are supplied to first and second SR flip-flops 120 and 130. In the phase difference detector, each of the two clock signals (F1 and F2) is supplied to the clock terminal of a respective flip-flop (101 and 102), and the input terminal of both flip-flops 101 and 102 is connected to a power source potential $V_{DD}$. A NAND gate 104 receives the output of both flip-flops 101 and 102. Each flip-flop (101 or 102) also supplies its output to a respective AND gate (107 or 108) through a pair of inverters (103 or 105). The output of the NAND gate 104 is supplied to both AND gates 107 and 108, and to the clear terminal of both flip-flops 101 and 102 through a pair of inverters 106.

An UP output signal of the phase difference detector 110 is supplied from the AND gate 107 (which receives the output of the flip-flop 101 supplied with the reference clock signal F1) to the set terminal of the first SR flip-flop 120. Similarly, a DOWN output signal is supplied from the AND gate 108 (which receives the output of the flip-flop 102 supplied with the output clock signal F2) to the set terminal of the second SR flip-flop 130. The reference clock signal F1 is supplied to the reset terminal of the first SR flip-flop 120 through an inverter 111, and the output clock signal F2 is supplied to the reset terminal of the second SR flip-flop 130 through another inverter 112. The UP' and DOWN' output signals, which are output by the phase comparator 14 as the phase comparator information, are supplied by the first and second SR flip-flops 120 and 130, respectively. Because the reset terminal of each SR flip-flop receives one of the inverted clock signals, the output signals UP' and DOWN' are equal in pulse width to the respective clock signal regardless of the phase difference between the two clock signals, as shown in FIG. 10(a).

As explained above, the phase comparator circuit 14 compares the phase of the output clock signal with the phase of the reference clock signal, and outputs phase comparator information. More specifically, if the phase of the output clock signal is behind the phase of the reference clock signal, the phase comparator outputs the UP' output signal to cause the adder/subtracter circuit 15 to subtract "1" from the load capacitance control information $E'_n$ output by the load capacitance control circuit 12 (see FIGS. 10(a) and 10(b)). The result is output to the variable delay circuit 16 as the load capacitance additive/subtractive control information $E_n$. As a result, one less capacitor is connected to the first stage inverters in the variable delay circuit, and the phase of the output clock signal is shifted slightly forward relative to the phase of the reference clock signal.

Figure 10A:
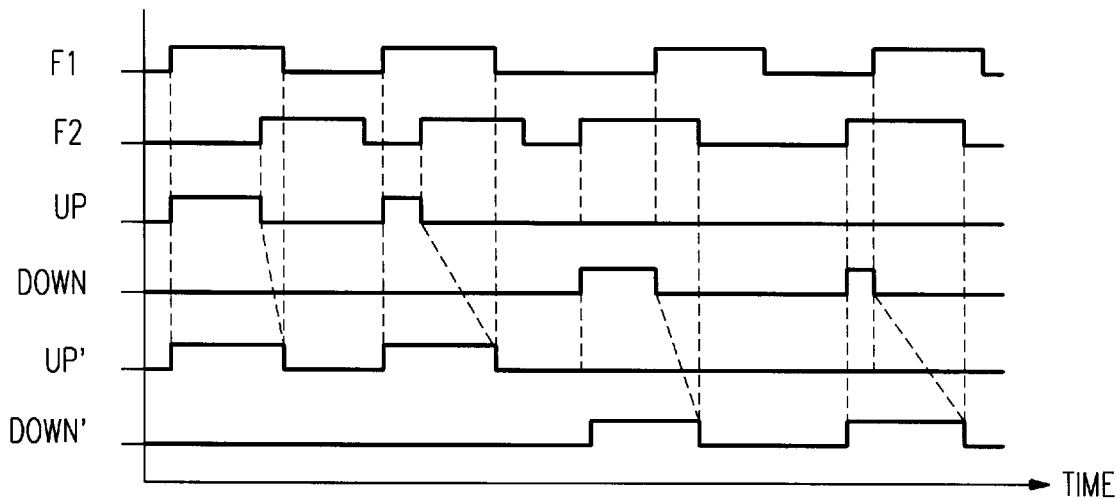
FIGS. 10(a) and 10(b) are timing charts explaining the operation of the phase comparator circuit of FIG. 4(b)
Figure 10B:
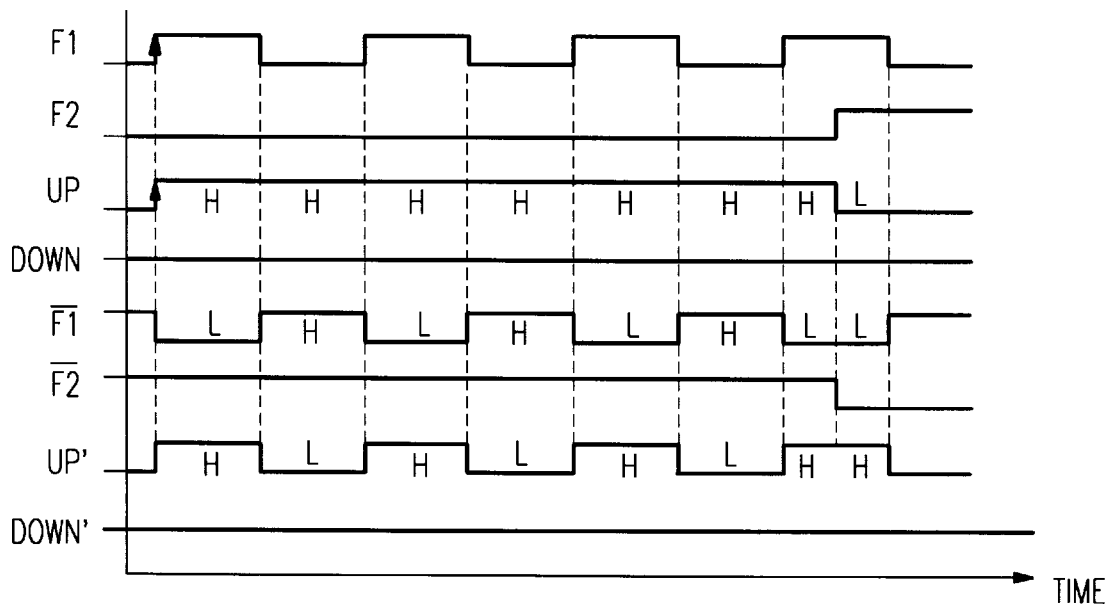
Figure 11:
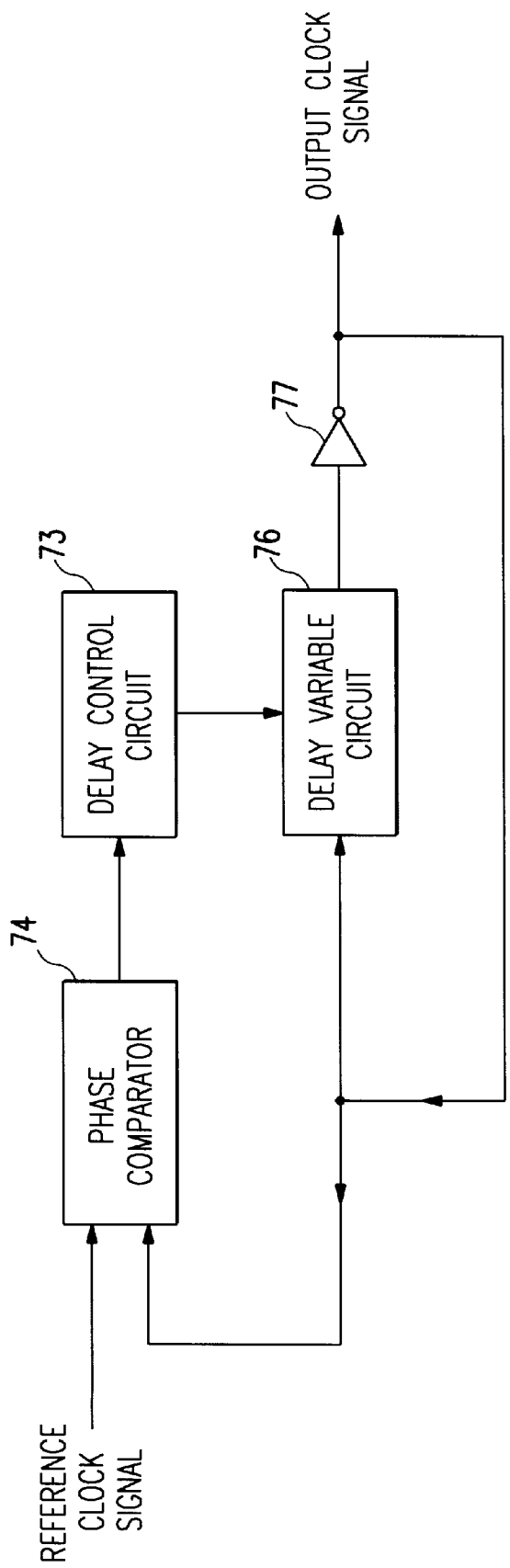
FIG. 11 is a block diagram of a conventional digital PLL circuit.

In contrast, if the phase of the output clock signal is ahead of the phase of the reference clock signal, the phase comparator outputs the DOWN' output signal to cause the adder/subtracter circuit 15 to add "1" to the load capacitance control information $E'_n$ output by the load capacitance control circuit 12 (see FIG. 10(a)). The result is output to the variable delay circuit 16 as the load capacitance additive/subtractive control information $E_n$. As a result, an additional capacitor is connected to the first stage inverters in the variable delay circuit, and the phase of the output clock signal is shifted slightly backward relative to the phase of the reference clock signal.

Significantly, the adder/subtracter circuit 15 merely repeats adding or subtracting "1" to or from the load capacitance control information $E'_n$ from the load capacitance control circuit 12 on the basis of the output of the phase comparator circuit 14. Therefore, the control information resulting from the addition or subtraction of "1" is never again subjected to the phase comparison operation. In other words, the adder/subtracter circuit 15 does not perform another addition or subtraction to the control information resulting from the original addition or subtraction of "1" to the load capacitance control information; the phase comparator can only change the output of the load capacitance control circuit by "1" (i.e., can only connect or disconnect one capacitor).

If the phase of the output clock signal and the phase of the reference clock signal coincide, the adder/subtracter circuit 15 ceases to perform any addition or subtraction. At this point, because both the number of connection stages and the output load capacitance are the same as those determined to lock the frequency of the PLL circuit, the oscillation frequency of the ring oscillator coincides with the frequency of the reference clock signal.

In the digital PLL circuit of the present invention, after the frequency comparison has been executed, the frequency of the output clock signal may be slightly changed during the phase matching operation. More specifically, when the addition or subtraction of "1" is performed on the load capacitance control information, the frequency of the output clock signal slightly changes from the frequency set by the frequency matching operation. Thus, the next comparison of frequencies should be affected by the phase matching operation. However, any change in the load capacitance control information due to the phase matching operation is corrected by the phase comparator circuit and the adder/subtracter circuit because comparison of the phases is executed every clock period while comparison of frequencies is executed only once every $2^{10}$, or 1024, clock periods (based on 10-bit counters). Furthermore, the phase comparator can only change by "1" the load capacitance control information set by the frequency comparison operation (as explained above), so at most the frequency is slightly changed during the phase matching operation.

Thus, the first embodiment of the present invention provides a digital PLL circuit output clock signal coinciding with the reference clock signal in both frequency and phase. That is, the digital PLL circuit according to the present invention realizes a digital PLL circuit having small jitter and a high accuracy that can be easily designed and controlled, thus avoiding a complicated control algorithm.

Figure 5:
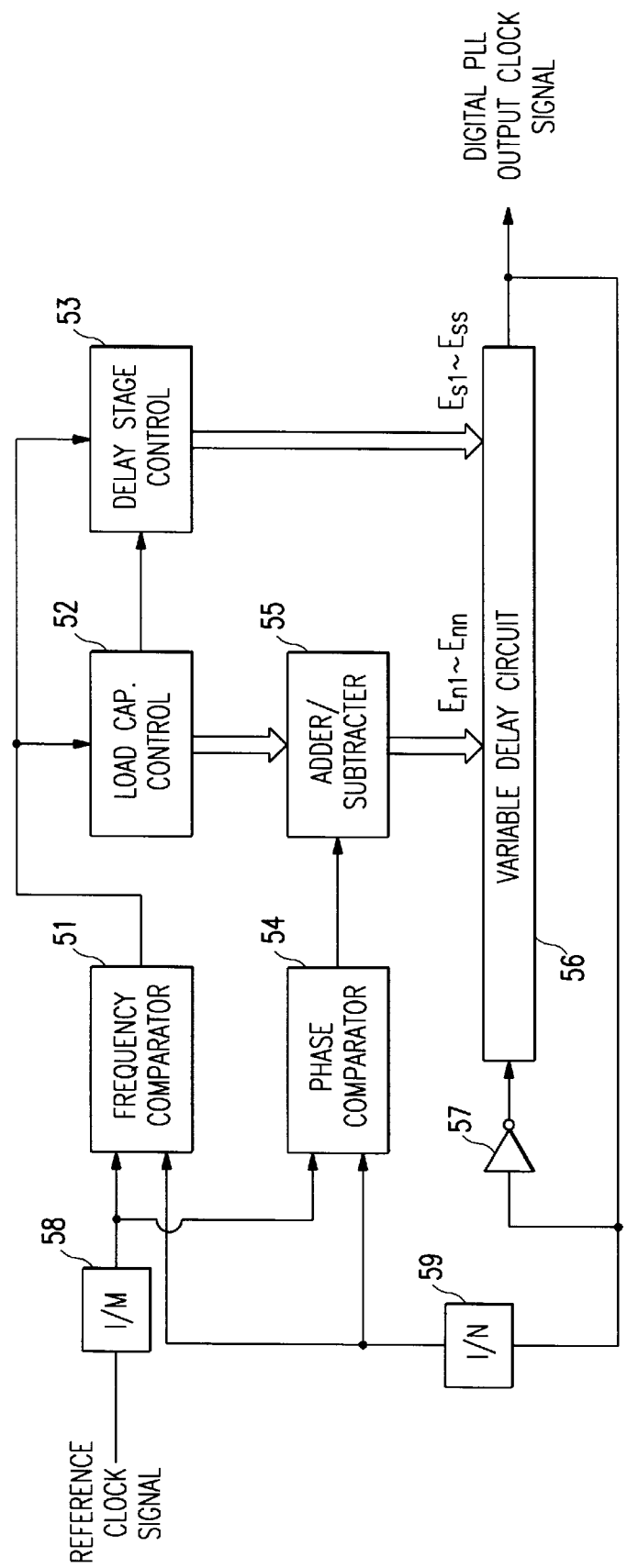
FIG. 5 is a block diagram of a digital PLL circuit according to a second embodiment of the present invention.

FIG. 5 is a block diagram of a digital PLL circuit according to a second embodiment of the present invention. In this embodiment, a 1/M divider 58 is connected between the reference clock signal and the frequency comparator circuit 51, and a 1/N divider 59 is connected between the output clock signal and both the phase comparator circuit 54 and the frequency comparator circuit 51. The other circuit elements that form the digital PLL circuit of the second embodiment are identical to those explained above for the first embodiment, so a description thereof is omitted. While operating similarly to the digital PLL circuit of the first embodiment, the output clock signal of the second embodiment has a frequency N/M times the frequency of the reference clock signal. For example, given that divider 58 is a ¼ divider and divider 59 is a ½ divider (i.e., M=4 and N=2), if the frequency of the reference clock signal is 8 kHz, the digital PLL circuit of the second embodiment provides an output clock signal with a frequency of 4 kHz.

Figure 6:
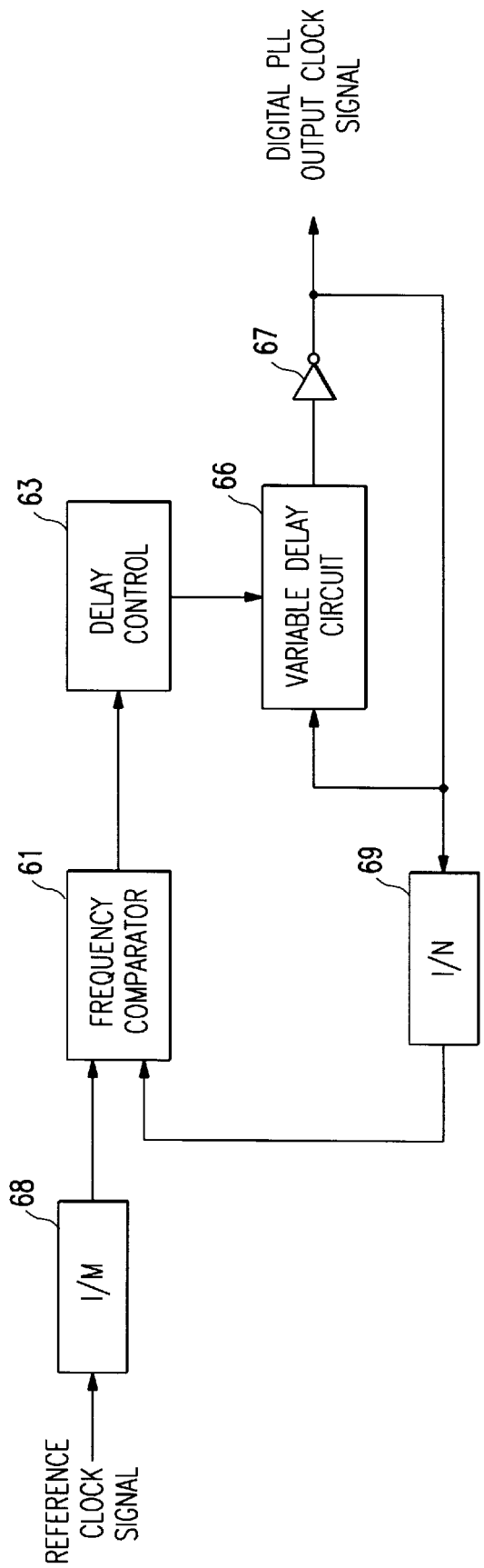
FIG. 6 is a block diagram of a digital PLL circuit according to a third embodiment of the present invention.

FIG. 6 is a block diagram of a digital PLL circuit according to a third embodiment of the present invention. In this embodiment, the phase comparator circuit and the adder/subtracter circuit are omitted from the PLL circuit of the second embodiment. The delay control circuit 63 used in the third embodiment preferably includes both a load capacitance control circuit and a delay stage control circuit (FIGS. 1 and 5). In the digital PLL circuit of the third embodiment, the output clock signal has a frequency N/M times the reference clock signal. However, the phases of the two clock signals are not matched. Thus, the PLL circuit of the third embodiment can only be used for circuits that do not require phase matching (e.g., as an internal clock of an LSI device that is operative in a high frequency band).

Figure 7:
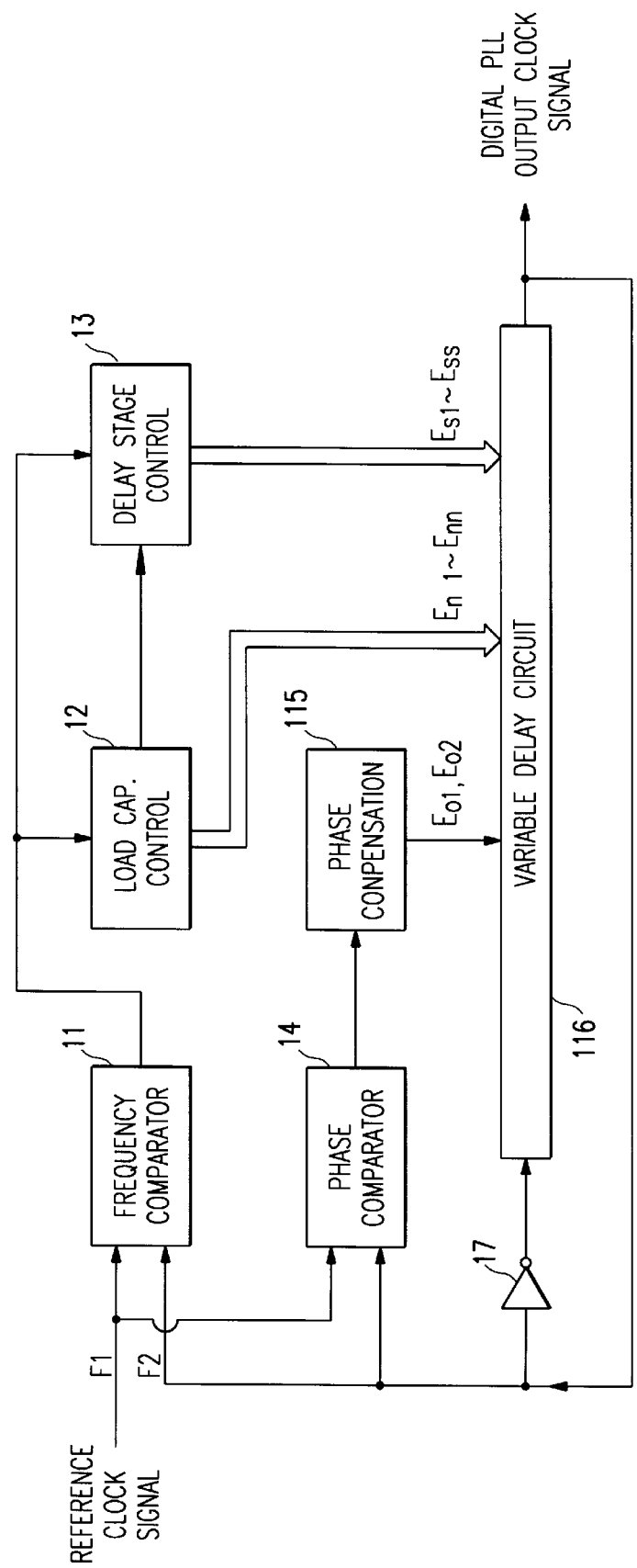
FIG. 7 is a block diagram of a digital PLL circuit according to a fourth embodiment of the present invention.

FIG. 7 is a block diagram of a digital PLL circuit according to a fourth embodiment of the present invention. In this embodiment, the adder/subtracter circuit 15 is replaced by a phase compensation circuit 115, and the load capacitance control information output by the load capacitance control circuit 12 is supplied directly to the variable delay circuit 116. More specifically, the phase compensation circuit 115 receives the output of the phase comparator circuit 14, and generates an output signal containing supplemental load capacitance control information. The variable delay circuit 116 receives the output of the load capacitance control circuit 12, the delay stage control circuit 13, and the phase compensation circuit 115. The variable delay circuit 116 controls the number of delay stages on the basis of the output of the delay stage control circuit 13, and controls the load capacitance based on the output of the load capacitance control circuit 12 and the phase compensation circuit 115.

Figure 8:
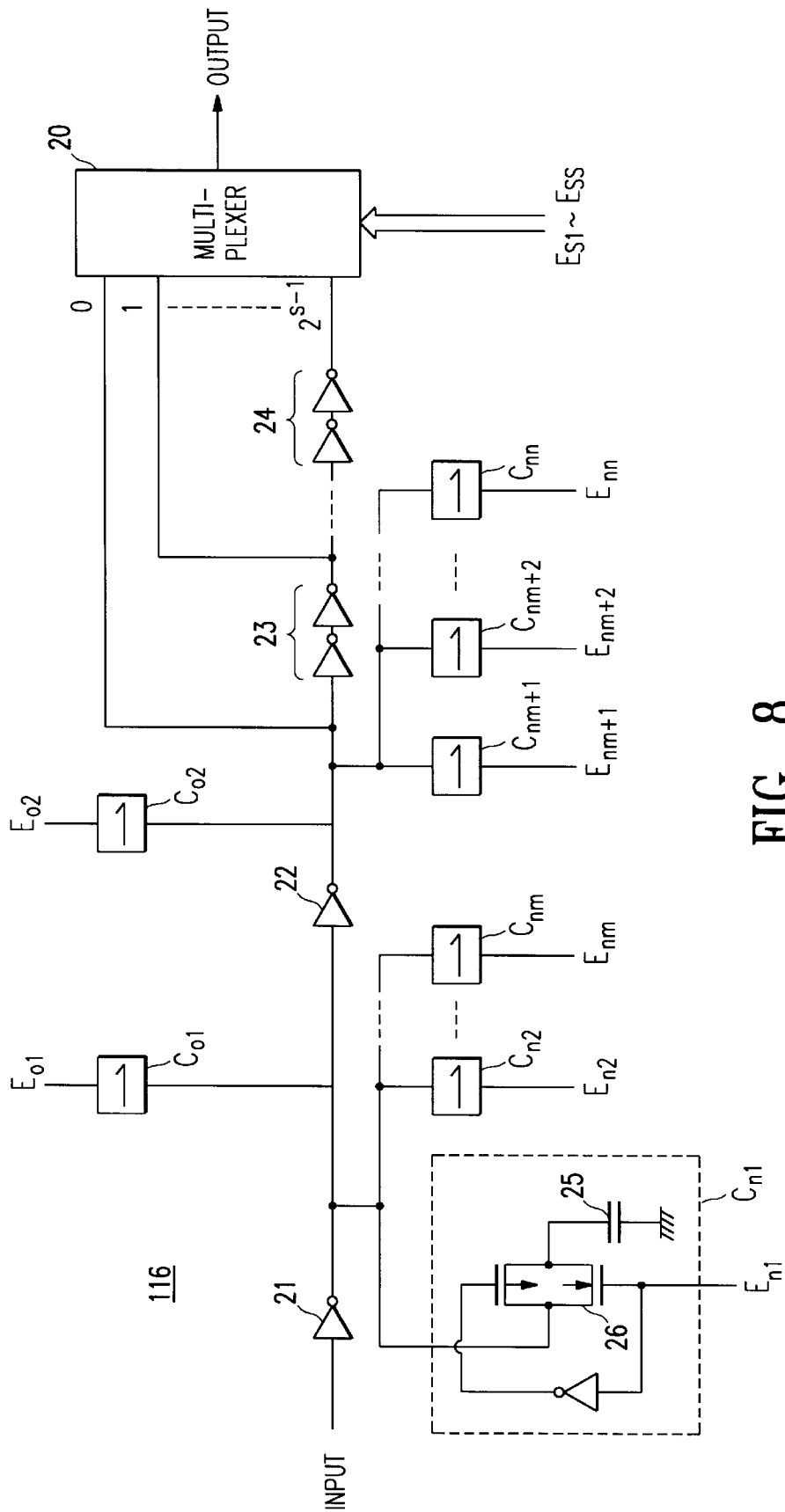
FIG. 8 is a block diagram of an embodiment of the variable delay circuit of FIG. 7.

FIG. 8 is a block diagram of a preferred embodiment of the variable delay circuit shown in FIG. 7. The variable delay circuit 116 of FIG. 8 is identical to the variable delay circuit 16 of FIG. 2, except two additional variable load capacitance circuits $C_{o1}$ and $C_{o2}$ are provided for setting the output load capacitances of the inverters 21 and 22 of the first stage on the basis of the value of the supplemental load capacitance control signals $E_{o1}$ and $E_{o2}$ (see FIG. 7). As explained above, the supplemental load capacitance control signals are output from the phase compensation circuit 115 based on the output of the phase comparator 14. Thus, the output load capacitance of the inverters 21 and 22 is increased or decreased based on the load capacitance control signals $E_n$ and the supplemental load capacitance control signals $E_o$.

The operation of the digital PLL circuit of FIGS. 7 and 8 to cause the frequencies of the reference clock signal and the output clock signal to coincide is identical to that explained above for the first embodiment. However, the operation of the digital PLL to cause the phases of the reference clock signal and the output clock signal to coincide is as follows. The phase matching is performed by the phase comparator circuit 14 and the phase compensation circuit 115 (FIG. 7). As explained above, the phase comparator circuit 14 compares the phase of the output clock signal with the phase of the reference clock signal, and outputs phase comparator information. If the phase of the output clock signal and the phase of the reference clock signal coincide, the phase compensation circuit 115 outputs supplemental load capacitance control signals $E_{o1}$ and $E_{o2}$ having values of "0" and "1" to the variable delay circuit 116. As a result, one of the additional variable load capacitance circuits $C_{o1}$ and $C_{o2}$ is connected to the first stage inverters in the variable delay circuit.

If the phase of the output clock signal is behind the phase of the reference clock signal, the phase comparator outputs the UP' output signal to cause the phase compensation circuit 115 to output supplemental load capacitance control signals $E_{o1}$ and $E_{o2}$ both having a value of "0" to the variable delay circuit 116. As a result, neither of the additional variable load capacitance circuits $C_{o1}$ and $C_{o2}$ is connected to the first stage inverters in the variable delay circuit, and the phase of the output clock signal is shifted slightly forward relative to the phase of the reference clock signal.

In contrast, if the phase of the output clock signal is ahead of the phase of the reference clock signal, the phase comparator outputs the DOWN output signal to cause the phase compensation circuit 115 to output supplemental load capacitance control signals $E_{o1}$ and $E_{o2}$ both having a value of "1" to the variable delay circuit 116. As a result, both of the additional variable load capacitance circuits $C_{o1}$ and $C_{o2}$ are connected to the first stage inverters in the variable delay circuit, and the phase of the output clock signal is shifted slightly backward relative to the phase of the reference clock signal. Thus, the phase comparator can only connect or disconnect two capacitors in the variable delay circuit.

Thus, the fourth embodiment of the present invention provides a digital PLL circuit output clock signal coinciding with the reference clock signal in both frequency and phase. Further, the phase compensation circuit has a simpler structure than the adder/subtracter circuit of the first embodiment, so the digital PLL circuit of the fourth embodiment is smaller and less complicated.

Figure 9A:
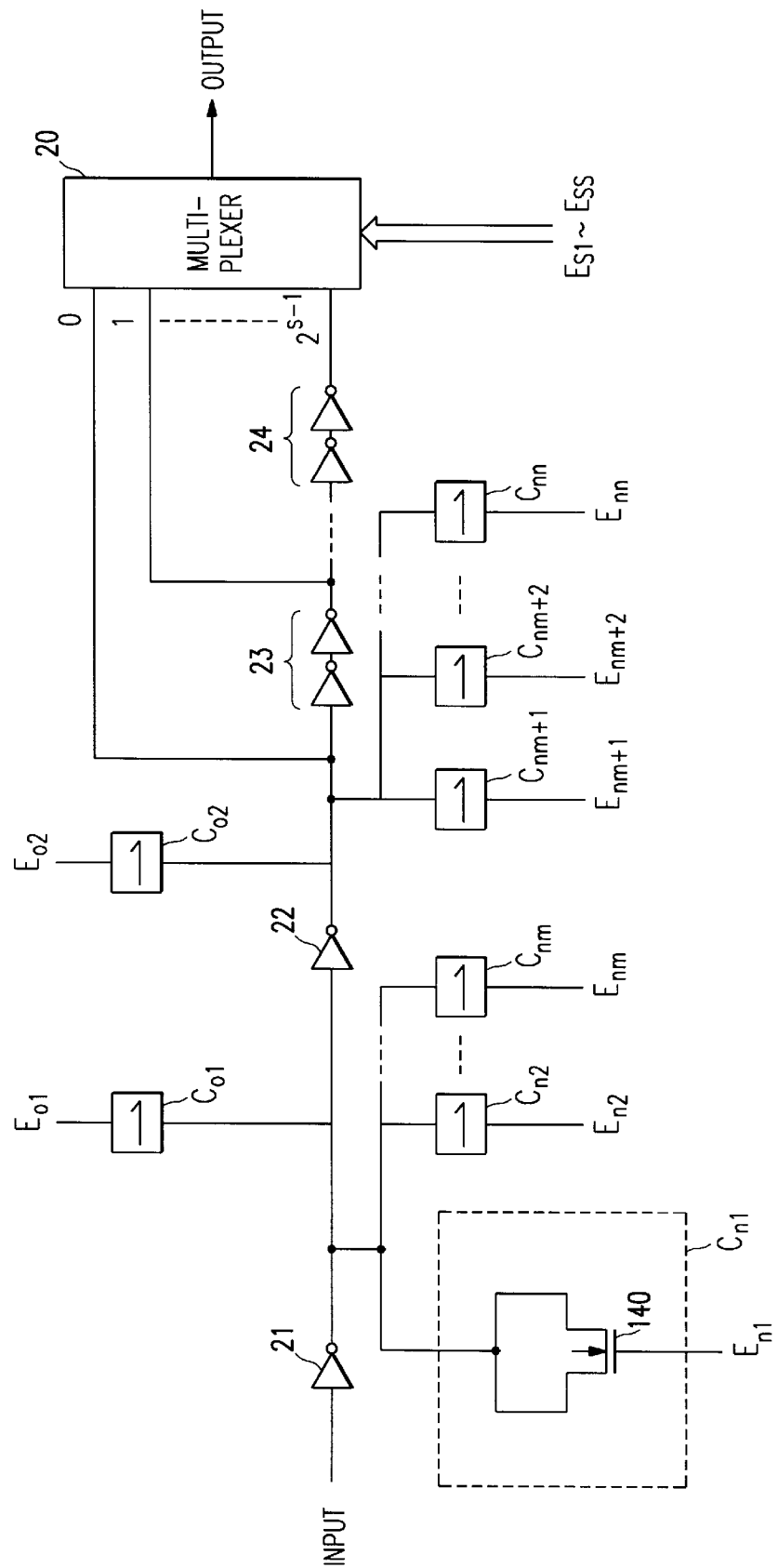
FIGS. 9(a) and 9(b) are block diagrams of further embodiments of the variable delay circuit of the present invention.
Figure 9B:
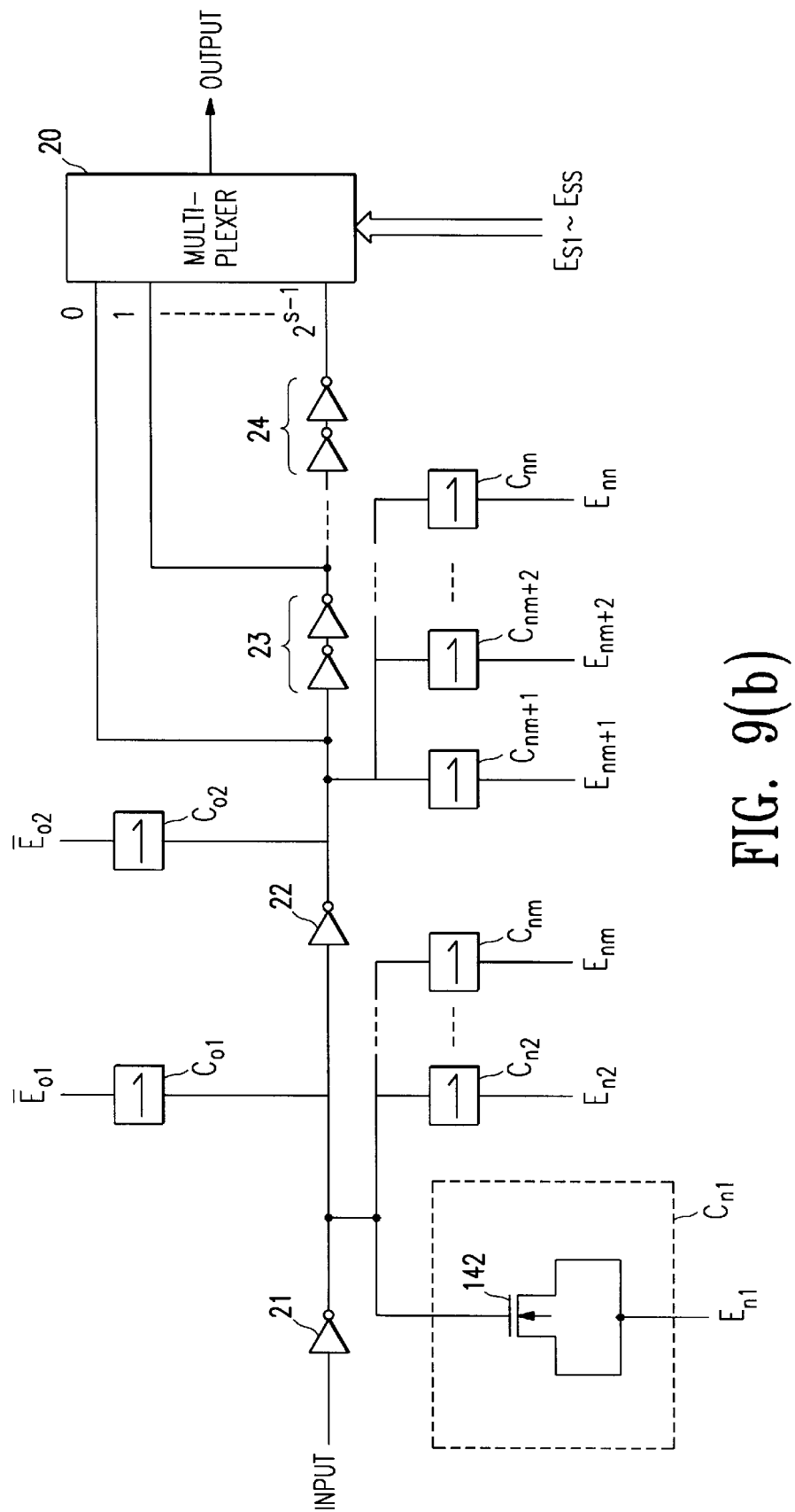

FIGS. 9(a) and 9(b) are block diagrams of further embodiments of the variable delay circuit of the present invention. These embodiments provide different structures for the variable load capacitance circuits. The other circuit elements are identical to those explained above for the variable delay circuit of FIG. 8, so a description thereof is omitted. In the embodiment of FIG. 9(a), each variable load capacitance circuit (e.g., $C_{n1}$) is formed by a MOS transistor 140 having its source and drain connected in common to the output of an inverter (21). The gate of the transistor 140 receives one of the control signals ($E_{n1}$). With this structure, the transistor 140 functions as a capacitance incorporated with an analog switch. More specifically, when the control signal has a value of "1" and the potential of the source and drain of the transistor are lower than $V_{DD}$-$V_{th}$ (i.e., the output of the corresponding inverter is "0"), a channel is formed under the gate of the MOS transistor. Therefore, the capacitance between the source and drain increases and causes a delay when the output of the inverter changes to "1". On the other hand, when the control signal has a value of "0", a channel is not formed under the gate of the transistor so the delay of the inverter is not increased.

In the embodiment of FIG. 9(b), each variable load capacitance circuit (e.g., $C_{n1}$) is formed by a MOS transistor 142 having its gate connected to the output of an inverter (21). The source and drain of the transistor 142 are connected together and receive an inverted control signal (/$E_{n1}$). With this structure, the transistor 142 functions as a capacitor when the inverted control signal has a value of "0". In particular, when the inverted control signal has a value of "0" and the potential of the gate of the transistor is higher than $V_{th}$ (i.e., the output of the corresponding inverter is "1"), a channel is formed under the gate of the MOS transistor. Therefore, the transistor operates as a capacitor and delays the output of the inverter. On the other hand, when the inverted control signal has a value of "1", the transistor does not function as a capacitor.

The variable delay circuits of FIGS. 9(a) and 9(b) operate similarly to the variable delay circuit of FIG. 8. However, in the embodiment of FIG. 8, each variable load capacitance circuit requires at least three transistors. On the other hand, in the embodiments of FIGS. 9(a) and 9(b), each variable load capacitance circuit requires only one transistor. Therefore, the size and complexity of the variable delay circuit is reduced. Further, in the embodiment of FIG. 9(a), the output of the inverter is connected to the source and drain of the MOS transistor so a parasitic capacitance forms between the drain region and well region, or between the source region and the well region. For example, in an NMOS transistor, a parasitic capacitance forms between the N$^+$-type drain region and the P-type well region. This parasitic capacitance influences the output of the inverter. On the other hand, in the embodiment of FIG. 9(b), the output of the inverter is directly connected to the gate of the MOS transistor so parasitic capacitance does not influence the output of the inverter. Thus, in the embodiment of FIG. 9(b), the output speed of the inverter is higher so a higher speed variable delay circuit can be realized.

As explained above, the present invention provides a digital PLL circuit having small jitter and a high accuracy that can be easily designed and controlled. A complicated control algorithm is avoided because the delay control circuit is controlled on the basis of the output of the frequency comparator.

Additionally, in the present invention, the delay value generated by the variable delay circuit can be accurately adjusted because the variable delay circuit includes first and second inverters, which are unaffected by changes in the number of connection stages, and the groups of two inverters, which are controlled by changes in the number of connection stages; and because the variable load capacitance circuits are connected to the outputs of the first and/or second inverters to provide capacitors that can be independently connected or disconnected. Further, accurate and continuous control of the delay value generated by the variable delay circuit is provided because the delay value generated by the load capacitance circuits when all of the capacitors are connected is equal to or larger than the delay value generated by one set of two inverters.

Although in the above-described embodiments the delay control circuit is controlled only on the basis of the output of the frequency comparator, the present invention is not limited to only such embodiments. The described embodiments could easily be adapted by one of ordinary skill in the art to include a delay control circuit that is controlled on the basis of the output of the frequency comparator and the output of the phase comparator. In such embodiments, the frequency comparator and the phase comparator would together control changes in the number of connection stages and the output load capacitance in the variable delay circuit.

While there has been illustrated and described what are presently considered to be the preferred embodiments of the present invention, it will be understood by those in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A digital PLL circuit comprising:
   a frequency comparator circuit for comparing frequencies of an output clock signal and a reference clock signal, and for generating frequency comparator information;
   a delay control circuit for generating a predetermined digital signal based on the frequency comparator information generated by the frequency comparator circuit; and
   a clock signal generating circuit for generating the output clock signal, the clock signal generating circuit changing the oscillation frequency of the output clock signal in response to the predetermined digital signal generated by the delay control circuit, the clock signal generating circuit including:
   a delay generating circuit having a plurality of delay generating stages, the delay generating circuit selectively changing the number of stages that are serially connected based at least partially on the predetermined digital signal generated by the delay control circuit, and
   a plurality of variable load capacitance circuits, the variable load capacitance circuits being selectively connected to the delay generating stages that are serially connected, in order to vary the load capacitance of the delay generating stages,
   wherein the variable load capacitance circuits are selectively connected based at least partially on the frequency comparator information.

2. The digital PLL circuit as defined in claim 1, wherein the frequency comparator circuit includes first and second counters, and a comparator for comparing count values output by the first and second counters.

3. The digital PLL circuit as defined in claim 1, wherein the clock signal generating circuit includes a ring oscillator, the ring oscillator having:
   an inverter; and
   a variable delay circuit that changes its delay value in response to the predetermined digital signal.

4. The digital PLL circuit as defined in claim 3, wherein the frequency comparator circuit includes first and second counters, and a comparator for comparing count values output by the first and second counters.

5. A digital PLL circuit comprising:
   a first frequency divider circuit for dividing the frequency of an output clock signal and generating a frequency-divided output clock signal;
   a second frequency divider circuit for dividing the frequency of a reference clock signal and generating a frequency-divided reference clock signal;
   a frequency comparator circuit for comparing frequencies of the frequency-divided output clock signal and the frequency-divided reference clock signal, and generating frequency comparator information;
   a delay control circuit for generating a predetermined digital signal based on the frequency comparator information generated by the frequency comparator circuit; and
   a clock signal generating circuit for generating the output clock signal, the clock signal generating circuit changing the oscillation frequency of the output clock signal in response to the predetermined digital signal generated by the delay control circuit, the clock signal generating circuit includes:
   a delay generating circuit having a plurality of delay generating stages, the delay generating circuit selectively changing the number of stages that are serially connected based at least partially on the predetermined digital signal generated by the delay control circuit; and
   a plurality of variable load capacitance circuits, the variable load capacitance circuits being selectively connected to the delay generating stages that are serially connected, in order to vary the load capacitance of the delay generating stages,
   wherein the variable load capacitance circuits are selectively connected based at least partially on the frequency comparator information.

6. A digital PLL circuit comprising:
   a frequency comparator circuit for comparing frequencies of an output clock signal and a reference clock signal to generate frequency comparator information;
   a phase comparator circuit for comparing phases of the output clock signal and the reference clock signal to generate phase comparator information;
   a variable frequency oscillator for generating the output clock signal, the frequency and phase of the output clock signal being controlled on the basis of the frequency comparator information and the phase comparator information to frequency and phase lock the output clock signal with the reference clock signal; and
   a load capacitance control circuit for generating load capacitance control information based on the frequency comparator information from the frequency comparator circuit and the phase comparator information from the phase comparator circuit.

7. The digital PLL circuit as defined in claim 6, further comprising a delay stage control circuit for generating delay stage control information based on the frequency comparator information generated by the frequency comparator circuit.

8. The digital PLL circuit as defined in claim 6, wherein the variable frequency oscillator includes a ring oscillator for generating the output clock signal, the ring oscillator including:
   a variable delay circuit for generating a variable delay value based on the delay stage control information and the load capacitance control information; and
   an inverter, an input of the inverter being connected to an output of the variable delay circuit and an output of the inverter being connected to an input of the variable delay circuit.

9. The digital PLL circuit as defined in claim 8, wherein the load capacitance control circuit includes:
   a first circuit for generating intermediate information based on the frequency comparator information from the frequency comparator circuit; and
   a second circuit responsive to the phase comparator information from the phase comparator circuit to selectively alter the intermediate information, to generate the load capacitance control information.

10. The digital PLL circuit as defined in claim 9, wherein the second circuit includes an adder/subtracter circuit responsive to the phase comparator information from the phase comparator circuit to execute addition or subtraction of "1" to or from the intermediate information, to generate the load capacitance control information.

11. The digital PLL circuit as defined in claim 8, wherein the variable delay circuit includes:
   a delay generating circuit having a plurality of delay generating stages, the delay generating circuit selectively changing the number of stages that are serially connected in response to the delay stage control information; and a plurality of variable load capacitance circuits, the variable load capacitance circuits being selectively connected to the delay generating stages that are serially connected in response to the load capacitance control information, in order to vary the load capacitance of the delay generating stages.

12. The digital PLL circuit as defined in claim 11, wherein the plurality of delay generating stages include:

a first delay generating stage, which has two inverters, that is serially connected regardless of changes in the number of connection stages; and second through $n^{th}$ delay generating stages, each of which has two inverters, the second through $n^{th}$ delay generating stages being selectively serially connected with each other and the first delay generating stage, wherein the variable load capacitance circuits include capacitors, and each of the variable load capacitance circuits is independently selectively connected to the first delay generating stage.

13. The digital PLL circuit as defined in claim 12, wherein the delay value added by the variable load capacitance circuits when all are connected is not less than the delay value added when an additional delay generating stage is serially connected.

14. The digital PLL circuit as defined in claim 13, wherein the frequency comparator circuit includes a frequency comparator which includes first and second counters, and a comparator for comparing count values of the first and second counters.

15. A digital PLL circuit comprising:

a first frequency divider circuit for dividing the frequency of an output clock signal to generate an N (N is an integer) frequency-divided output clock signal;

a second frequency divider circuit for dividing the frequency of a reference clock signal to generate an M(M is an integer) frequency-divided reference clock signal;

a frequency comparator circuit for comparing frequencies of the frequency-divided output clock signal and the frequency-divided reference clock signal, to generate frequency comparator information;

a phase comparator circuit for comparing phases of the frequency-divided output clock signal and the frequency-divided reference clock signal, to generate phase comparator information;

a variable frequency oscillator for generating the output clock signal, the frequency and phase of the output clock signal being controlled on the basis of the frequency comparator information and the phase comparator information, to phase lock the output clock signal with the reference clock signal and to provide the output clock signal with a frequency N/M times the frequency of the reference clock signal; and a load capacitance control circuit for generating load capacitance control information based on the frequency comparator information and the phase comparator information.

16. The digital PLL circuit as defined in claim 15, further comprising a delay stage control circuit responsive to the frequency comparator output information from the frequency comparator circuit to generate delay stage control information.

17. The digital PLL circuit as defined in claim 15, wherein the variable frequency oscillator includes:

a ring oscillator for generating the output clock signal, the ring oscillator including:

a variable delay circuit for generating a variable delay value; and an inverter, an input of the inverter being connected to an output of the variable delay circuit and an output of the inverter being connected to an input of the variable delay circuit.

18. The digital PLL circuit as defined in claim 17, wherein the load capacitance control circuit includes:

a first circuit for generating intermediate information based on the frequency comparator information from the frequency comparator circuit; and a second circuit responsive to the phase comparator information from the phase comparator circuit to selectively alter the intermediate information, to generate the load capacitance control information.

19. The digital PLL circuit as defined in claim 18, wherein the second circuit includes an adder/subtracter circuit responsive to the phase comparator information from the phase comparator circuit to execute addition or subtraction of "1" to or from the intermediate information, to generate the load capacitance control information.

20. The digital PLL circuit as defined in claim 17, wherein the variable delay circuit includes:

a delay generating circuit having a plurality of delay generating stages, the delay generating circuit selectively changing the number of stages that are serially connected in response to the delay stage control information; and a plurality of variable load capacitance circuits, the variable load capacitance circuits being selectively connected to the delay generating stages that are serially connected in response to the load capacitance control information, in order to vary the load capacitance of the delay generating stages.

21. The digital PLL circuit as defined in claim 17, wherein the plurality of delay generating stages include:

a first delay generating stage, which has two inverters, that is serially connected regardless of changes in the number of connection stages; and second through $n^{th}$ delay generating stages, each of which has two inverters, the second through $n^{th}$ delay generating stages being selectively serially connected with each other and the first delay generating stage, wherein the variable load capacitance circuits include capacitors, and each of the variable load capacitance circuits is independently selectively connected to the first delay generating stage.

22. The digital PLL circuit as defined in claim 21, wherein the delay value added by the variable load capacitance circuits when all are connected is not less than the delay value added when an additional delay generating stage is serially connected.

* * * * *